NON-DEGENERATIVE PARAMETRIC AMPLIFIER
Filed March 22, 1972
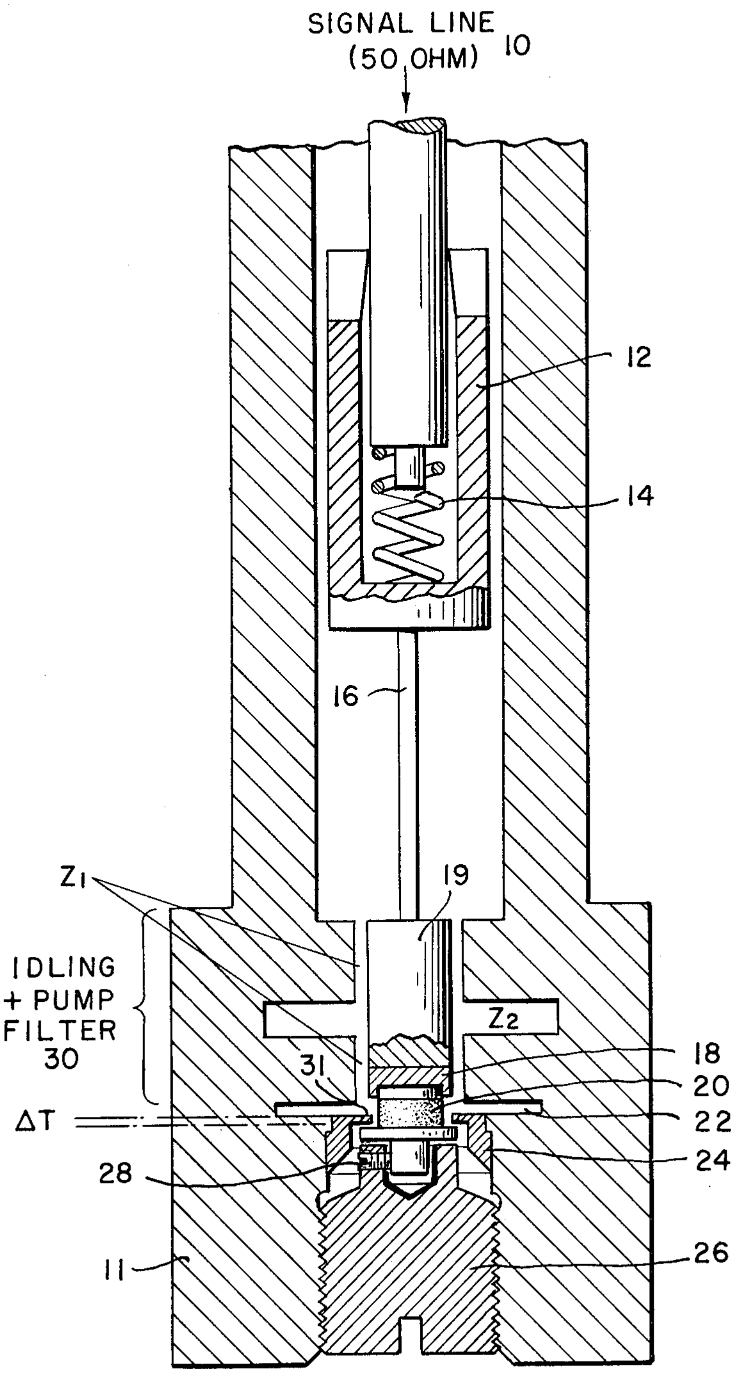

United States Patent Office 3,718,866

Patented Feb. 27, 1973

3,718,866

NON-DEGENRATIVE PARAMETRIC AMPLIFIER

Jochen Edrich, Denver, Colo., assignor to the United States of America as represented by the Secretary of the Navy Filed Mar. 22, 1972, Ser. No. 236,935
Int. Cl. H03f 7/04
U.S. Cl. 330—4.9 5 Claims

ABSTRACT OF THE DISCLOSURE

A low noise, cooled or uncooled parametric amplifier especially suited for radio astronomy receivers. The amplifier employs a novel diode mount, a pump, an idling filter, and an impedance transformer for a single ended amplifier so as to produce large bandwidth and a wide tuning range.

BACKGROUND OF THE INVENTION

Non-degenerative parametric amplifiers have an application in many fields which require the detection of weak signals in the form of electro-magnetic radiation. One of the most common applications appears in the field of radio astronomy, where a large instantaneous bandwidth, and especially a wide tuning range becomes very very important. The heart of the non-degenerative parametric amplifier is the varactor diode. The successfulness of the amplifier's operation depends upon how well the varactor diode is mounted, and if it is able to maintain a predictable change when the ambient temperature changes.

Although a number of methods of mounting the varactor diode in the parametric amplifier have been successful, most of these methods require an individual adjustment and a manual fitting of each diode into its respective amplifier. Thus until now, it has been virtually impossible to mount a varactor diode into a parametric amplifier in an assembly line manner without introducing stray reactances and resistive losses caused by the mounting structure.

SUMMARY OF THE INVENTION

A special, extremely thin insert and a spring loading mechanism are used in conjunction with each other to mount the varactor diode in the parametric amplifier. strong and shock proof and may therefore be used in cooled or uncooled paramps. Furthermore, a combined idling and pump filter is simultaneously employed with the varactor diode at the idling frequency. This has the effect of increasing the overall bandwidth of the device and provides a larger electronic tuning range. These features coupled with the low noise temperature capability are very important in radio astronomy received, and are enhanced by the instant improved varactor diode mounting structure.

OBJECTS OF THE INVENTION

It is therefore an object of the present invention to provide a low noise, cooled or uncooled, non-degenerative parametric amplifier.

Another object of the present invention is to provide a varactor mounting structure which is easily reproduced.

A further object of the present invention is to provide a parametric amplifier having a bandwidth of more than 30 mHz. at 20 db. gain, a noise temperature of less than 20° K. and a wide tuning range.

Other objects of the invention will be readily apparent to those skilled in the art by referring to the following detailed description in connection with the accompanying drawing.

BRIEF DESCRIPTION OF THE DRAWING

The figure is a partial cross-sectional view of a non-degenerative parametric amplifier.

DETAILED DESCRIPTION

Basically, with reference to the figure, the operation of a parametric amplifier consists of accepting a signal from signal line 10, passing the signal through impedance transformer section 12 to the varactor 20.

A high frequency signal is applied to the varactor 20 in the region of pump waveguide 22 in the typical, well known manner. The high frequency is beaten by the idling frequency for amplification purposes. The amplified signal returns back through the 50 ohm line 10 but must be filtered by the idling and pump filter 30.

A serious problem in this type of non-degenerative paramps is the idling circuit supplying energy through pump waveguide 22. The mid-band frequency of this idling circuit usually is chosen to be in high in order to achieve a low noise temperature and a large bandwidth. However, these high idling frequencies also cause stray reactance and the losses around the varactor mounting structure become so large that they tend to deteriorate any achievable bandwith and seriously affect the noise temperature.

As a solution to this problem, the varactor 20 (being a pill or micropill type, with or without prongs) is held in place against special lip 31 of insert 24 by mounting screw 26. The insert 24 has a through hole slightly larger than the diameter of the ceramic portion of the vacator 20 such that the varactor may be exposed to the signal and the high idling frequency by way of pump waveguide 22 for amplification purposes. The thickness of annular lip 31 of insert 24 is shown as $\Delta T$ and made extremely thin, for example, .005". The material from which the insert is made must be strong enough to withstand the required contact pressure, applied by way of mounting screw 26, and must have good surface conductivity for signals at high frequencies. I have found that gold-plated copper, berylium or steel perform especially well, and an insert made of such material can be easily pressed into the main body 11.

When the varactor diode 20 is properly mounted and abutted against lip 31 of the insert 24 a conductive cap 19 is urged against the top surface of the diode. The pressure placed upon the diode 20 results from the spring loading mechanism 14 thus forcing the ridged high impedance signal line 16, cap 19, and a gold plated solder insert 18 against the surface of diode 20.

As can be readily seen, this technique provides low stray reactance since the capacitance appears across the diode 20, and inductance appears in series with the diode 20. Also, it should be noted that the resistance is in series with the varactor and therefore provides low losses.

Another advantage of this structure is the fact that the entire amplifier may be cooled down to a few degrees Kelvin because of the strong yet elastic mounting structure of insert 24. Also, as a result of the diode mounting screw 26 holding varactor diode 20 in place by set screw 28, a stable and shock proof construction results especially since the structure is forced to abut lip 31 and press against conductive cap 19.

The structure as set forth in the figure also provides a large electronic tuning range. The unique pump and filter 30 provide the required short for the diode at the idling frequency as well as a rejection mechanism for pump energy flowing into the signal line 10. This can best be seen by considering two $\lambda_{idling}/4$ coaxial line sections with low impedances as shown in the figure as Z, with a high impedance section $Z_2$, disposed between. The difference of outer and inner diameter of the impedance sections is approximately $\lambda_{idling}/2$ as in the well-known radial choke, however, most importantly, the axial length is nearly $\lambda_{idling}/4$ long and is therefore contrary to the short radial choke. Thus, the novel design also provides the features of an excellent pump and idling filter.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. In a parametric amplifier having a pill type varactor diode with a protruding annular ridge below the diode portion, means for providing a pump frequency to said diode, and transmission line means for conducting a signal to and away from said diode, wherein the improvement comprises:

the diode being mounted in said amplifier by an abutment of said annular ridge against an annular lip which forms the bottom of said pump means.

2. The device as claimed in claim 1 wherein said annular lip is an integral portion of an annular insert which may be pressed into the body of the amplifier.

3. The device as claimed in claim 2 wherein said insert is a gold plated metal.

4. The device as claimed in claim 3 wherein said lip is approximately .005″ thick.

5. The device as claimed in claim 1 wherein said transmission line means includes:

a spring loading means for urging a ridged cap against the top of said diode a broadband filter for idling and pump frequency containing two low-impedance coaxial line sections and one high-impedance coaxial line section, which has an axial length of approximately $\lambda_{idling}/4$ and a difference of outer and inner diameter of approximately $\lambda_{idling}/2$.

References Cited

UNITED STATES PATENTS

| | | | |
|---|---|---|---|
| 3,195,063 | 7/1965 | Collard et al. | 330—4.9 |
| 3,683,298 | 8/1972 | Kawamoto | 333—84 M |

ROY LAKE, Primary Examiner

D. R. HOSTETTER, Assistant Examiner

U.S. Cl. X.R.

333—98 R